(12) United States Patent
Honaga et al.

(10) Patent No.: US 8,872,188 B2
(45) Date of Patent: Oct. 28, 2014

(54) SILICON CARBIDE SEMICONDUCTOR DEVICE AND METHOD OF MANUFACTURING THEREOF

(75) Inventors: Misako Honaga, Osaka (JP); Shin Harada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/501,373

(22) PCT Filed: Jan. 19, 2010

(86) PCT No.: PCT/JP2010/050563
§ 371 (c)(1),
(2), (4) Date: Apr. 11, 2012

(87) PCT Pub. No.: WO2011/089687
PCT Pub. Date: Jul. 28, 2011

(65) Prior Publication Data
US 2012/0199850 A1    Aug. 9, 2012

(51) Int. Cl.
| | |
|---|---|
| *H01L 29/12* | (2006.01) |
| *H01L 29/78* | (2006.01) |
| *H01L 21/3105* | (2006.01) |
| *H01L 29/04* | (2006.01) |
| *H01L 29/66* | (2006.01) |
| *H01L 21/04* | (2006.01) |
| *H01L 29/16* | (2006.01) |
| *H01L 21/02* | (2006.01) |
| *H01L 29/06* | (2006.01) |

(52) U.S. Cl.
CPC .......... *H01L 29/7802* (2013.01); *H01L 29/045* (2013.01); *H01L 29/1608* (2013.01); *H01L 21/02529* (2013.01); *H01L 21/02378* (2013.01); *H01L 29/0696* (2013.01); *H01L 21/02433* (2013.01); *H01L 29/66068* (2013.01); *H01L 21/049* (2013.01); *H01L 21/02609* (2013.01)
USPC .............................. 257/77; 257/76; 438/478

(58) Field of Classification Search
CPC ...... H01L 29/12; H01L 29/78; H01L 21/3105
USPC ....................................... 257/77, 76; 438/478
See application file for complete search history.

(56) References Cited

U.S. PATENT DOCUMENTS 5,744,826 A * 4/1998 Takeuchi et al. ................. 257/77
6,384,428 B1   5/2002 Oono et al.
(Continued)

FOREIGN PATENT DOCUMENTS

CN    1286805 A    3/2001
EP    1 065 726 A1    1/2001
(Continued)

OTHER PUBLICATIONS

Notice of Grounds of Rejection in Japanese Patent Application No. 2008-292370, dated Aug. 27, 2013.*
(Continued)

*Primary Examiner* — Kevin Parendo
*Assistant Examiner* — Charles N Ausar-El
(74) *Attorney, Agent, or Firm* — Venable LLP; Michael A. Sartori; Tamatane J. Aga

(57) ABSTRACT

A silicon carbide semiconductor device is provided that includes a semiconductor layer made of silicon carbide and having a surface tilted at an angle in a range of not less than 50° and not more than 65° relative to the {0001} plane, and an insulating film formed to contact the surface of the semiconductor layer. A maximum value of the nitrogen concentration in a region within 10 nm from the interface between the semiconductor layer and the insulating film is not less than $1\times10^{21}$ cm$^{-3}$, and the semiconductor device has a channel direction in a range of ±10° relative to the direction orthogonal to the <-2110> direction in the surface of the semiconductor layer. A method of manufacturing the silicon carbide semiconductor device is also provided.

11 Claims, 7 Drawing Sheets

(56) References Cited

U.S. PATENT DOCUMENTS

| | | | |
|---|---|---|---|
| 6,734,461 B1* | 5/2004 | Shiomi et al. | 257/77 |
| 6,794,257 B2* | 9/2004 | Ishikawa et al. | 438/287 |
| 7,641,736 B2* | 1/2010 | Hirooka | 117/97 |
| 7,768,017 B2* | 8/2010 | Nakayama et al. | 257/77 |
| 8,450,750 B2* | 5/2013 | Honaga et al. | 257/77 |
| 2005/0077569 A1* | 4/2005 | Yamashita et al. | 257/330 |
| 2008/0081403 A1* | 4/2008 | Gehring et al. | 438/187 |
| 2008/0128862 A1* | 6/2008 | Sugimoto et al. | 257/615 |
| 2010/0207125 A1* | 8/2010 | Uchida et al. | 257/77 |
| 2011/0031505 A1 | 2/2011 | Harada et al. | |
| 2011/0186862 A1* | 8/2011 | Harada et al. | 257/77 |
| 2011/0297963 A1 | 12/2011 | Honaga et al. | |
| 2013/0224941 A1 | 8/2013 | Honaga et al. | |

FOREIGN PATENT DOCUMENTS

| | | | | |
|---|---|---|---|---|
| EP | 1 229 591 A1 | | 8/2002 | |
| EP | 1 689 000 A1 | | 8/2006 | |
| JP | 2001-144288 | | 5/2001 | |
| JP | 2001-144288 A | * | 5/2001 | H01L 29/12 |
| JP | 2002-261275 A | | 9/2002 | |
| JP | 2005-136386 A | * | 5/2005 | H01L 21/318 |
| JP | 2005-340685 A | * | 12/2005 | H01L 21/336 |
| JP | 2005340685 | * | 12/2005 | H01L 21/336 |
| JP | 2006-156478 A | * | 6/2006 | H01L 21/336 |
| JP | 2006-210818 A | | 8/2006 | |
| JP | 2009-158933 | | 7/2009 | |
| JP | 2009-164571 | | 7/2009 | |
| JP | 2010-040564 A | | 2/2010 | |
| JP | 2010-041021 | | 2/2010 | |
| WO | WO-01/18872 A1 | | 3/2001 | |

OTHER PUBLICATIONS

Extended European Search Report in European Patent Application No. 10843853.2, dated Nov. 22, 2013.

Office Action in Chinese Patent Application No. 201080055687.9, dated May 6, 2014.

* cited by examiner

SILICON CARBIDE SEMICONDUCTOR DEVICE AND METHOD OF MANUFACTURING THEREOF

TECHNICAL FIELD

The present invention relates to a silicon carbide semiconductor device and a method of manufacturing thereof, and particularly to a silicon carbide semiconductor device exhibiting excellent electrical characteristics and a method of manufacturing thereof.

BACKGROUND ART

Conventionally, silicon carbide semiconductor devices in which silicon carbide (SiC) is used have been known, and an example of them is disclosed in WO01/018872 (hereinafter "PTL 1") for example. PTL 1 discloses a MOS-type field effect transistor (MOSFET) that is formed as a silicon carbide semiconductor device using an SiC substrate of the 4H polytype having a surface orientation of substantially {03-38}. According to PTL 1 disclosing the MOSFET, a gate oxide film is formed by dry oxidation and a high channel mobility (about 100 cm²/Vs) can be achieved.

CITATION LIST

Patent Literature

PTL 1: WO01/018872

SUMMARY OF INVENTION

Technical Problem

In order for a silicon carbide semiconductor device in which SiC is used to stably exhibit its excellent electrical characteristics, it is required to achieve a high channel mobility with high reproducibility.

The inventors of the present invention have conducted studies to found, however, that even the MOSFET disclosed in PTL 1 may not have a sufficiently high channel mobility depending on the case.

In view of the circumstances above, an object of the present invention is to provide a silicon carbide semiconductor device capable of achieving a high channel mobility with high reproducibility, and a method of manufacturing the same.

Solution to Problem

The present invention is a silicon carbide semiconductor device including a semiconductor layer made of silicon carbide and having a surface tilted at an angle in a range of not less than 50° and not more than 65° relative to a {0001} plane, and an insulating film formed to contact the surface of the semiconductor layer, a maximum value of a nitrogen concentration in a region within 10 nm from an interface between the semiconductor layer and the insulating film is not less than $1 \times 10^{21}$ cm$^{-3}$, and the silicon carbide semiconductor device has a channel direction in a range of ±10° relative to a direction orthogonal to a <−2110> direction in the surface of the semiconductor layer.

Further, the present invention is a silicon carbide semiconductor device including: a substrate made of silicon carbide of a first conductive type; a semiconductor layer made of silicon carbide of the first conductive type, formed on a surface of the substrate, containing a first-conductive-type impurity of a lower concentration than the substrate, and having a surface tilted at an angle in a range of not less than 50° and not more than 65° relative to a {0001} plane; a second-conductive-type impurity diffusion layer formed in the surface of the semiconductor layer; a first-conductive-type impurity diffusion layer formed in a surface of the second-conductive-type impurity diffusion layer; an insulating film formed to contact the surface of the semiconductor layer; a source electrode formed to contact at least a part of a region, except for a portion where the insulating film is formed, of the surface of the semiconductor layer; a gate electrode formed on the insulating film; and a drain electrode formed on a surface of the substrate opposite to the surface of the substrate on which the semiconductor layer is formed. A maximum value of a nitrogen concentration in a region within 10 nm from an interface between the semiconductor layer and the insulating film is not less than $1 \times 10^{21}$ cm$^{-3}$, and the silicon carbide semiconductor device has a channel direction in a range of ±10° relative to a direction orthogonal to a <−2110> direction in the surface of the semiconductor layer.

Further, the present invention is a silicon carbide semiconductor device including: a substrate made of silicon carbide of a first conductive type; a semiconductor layer made of silicon carbide of the first conductive type, formed on the substrate, containing a first-conductive-type impurity of a lower concentration than the substrate, and having a surface tilted at an angle in a range of not less than 50° and not more than 65° relative to a {0001} plane; a second-conductive-type impurity diffusion layer formed in the surface of the semiconductor layer; a first-conductive-type impurity diffusion layer formed in a surface of the second-conductive-type impurity diffusion layer; an insulating film formed to contact the surface of the semiconductor layer; a source electrode formed to contact a part of a region, except for a portion where the insulating film is formed, of the surface of the semiconductor layer; a drain electrode formed to contact another part of the region, except for the portion where the insulating film is formed, of the surface of the semiconductor layer; and a gate electrode formed on the insulating film. A maximum value of a nitrogen concentration in a region within 10 nm from an interface between the semiconductor layer and the insulating film is not less than $1 \times 10^{21}$ cm$^{-3}$, and the silicon carbide semiconductor device has a channel direction in a range of ±10° relative to a direction orthogonal to a <−2110> direction in the surface of the semiconductor layer.

Here, in the silicon carbide semiconductor device of the present invention, preferably the source electrode has a surface in a stripe pattern.

Further, in the silicon carbide semiconductor device of the present invention, preferably the source electrode has a surface in a honeycomb pattern.

Further, in the silicon carbide semiconductor device of the present invention, preferably the surface of the semiconductor layer is a crystal plane tilted at an angle in a range of ±5° relative to a {03-38} plane.

Furthermore, the present invention is a method of manufacturing a silicon carbide semiconductor device, including the steps of: forming a semiconductor layer made of silicon carbide and having a surface tilted at an angle in a range of not less than 50° and not more than 65° relative to a {0001} plane; inspecting a direction orthogonal to a <−2110> direction in the surface of the semiconductor layer; forming an insulating film contacting a part of the surface of the semiconductor layer so that a channel direction is set in a range of ±10° relative to the direction orthogonal to the <−2110> direction in the surface of the semiconductor layer; and adjusting a nitrogen concentration so that a maximum value of the nitrogen concentration in a region within 10 nm from an interface between the semiconductor layer and the insulating film is not less than $1 \times 10^{21}$ cm$^{-3}$.

Here, regarding the method of manufacturing a silicon carbide semiconductor device of the present invention, preferably the direction orthogonal to the <−2110> direction in the surface of the semiconductor layer is inspected based on an orientation of a defect included in the semiconductor layer.

Further, regarding the method of manufacturing a silicon carbide semiconductor device of the present invention, preferably the step of adjusting the nitrogen concentration includes the step of performing a heat treatment in an atmosphere of a gas containing nitrogen, on the semiconductor layer where the insulating film is formed.

Further, regarding the method of manufacturing a silicon carbide semiconductor device of the present invention, preferably the step of adjusting the nitrogen concentration includes the step of performing, on the semiconductor layer having undergone the heat treatment, a heat treatment in an atmosphere of an inert gas.

Advantageous Effects of Invention

The present invention can provide a silicon carbide semiconductor device that can achieve a high channel mobility with high reproducibility, as well as a method of manufacturing the same.

DESCRIPTION OF EMBODIMENTS

Figure 1:
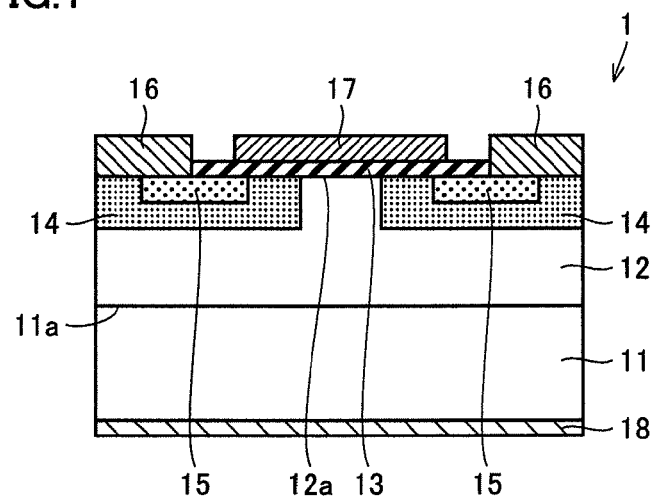
FIG. 1 is a schematic cross section of an example of a vertical DiMOSFET that is an example of the silicon carbide semiconductor device of the present invention.

Embodiments of the present invention will hereinafter be described. In the drawings of the present invention, the same reference characters denote the same or corresponding parts.

Where crystal plane and direction are to be expressed, they should actually be expressed with a bar on a required number. Because of restricted expression means, however, they are expressed in the present invention with "−" added before a required number instead of a bar on the required number. Further, in the present invention, an individual orientation is denoted in [ ], a group orientation is denoted in < >, an individual plane is denoted in ( ), and a group plane is denoted in { }.

First Embodiment

FIG. 1 shows a schematic cross section of an example of a vertical DiMOSFET (Double Implanted Metal Oxide Semiconductor Field Effect Transistor) that is an example of the silicon carbide semiconductor device of the present invention.

A silicon carbide semiconductor device 1 shown in FIG. 1 includes a substrate 11 made of silicon carbide of n type and 4H—SiC polytype for example, a semiconductor layer 12 made of silicon carbide of n type formed on a surface 11a of substrate 11, a second-conductive-type impurity diffusion layer 14 that is a p-type region formed in a surface 12a of semiconductor layer 12, a first-conductive-type impurity diffusion layer 15 that is an n-type region formed in a surface of second-conductive-type impurity diffusion layer 14 (also in surface 12a of semiconductor layer 12), an insulating film 13 formed to contact surface 12a of semiconductor layer 12, a source electrode 16 formed in a region of surface 12a of semiconductor layer 12 other than a region where insulating film 13 is formed, a gate electrode 17 formed on a surface of insulating film 13, and a drain electrode 18 formed on the back surface of substrate 11.

Here, surface 11a of substrate 11 on which semiconductor layer 12 is formed is a crystal plane tilted at an angle in a range of not less than 50° and not more than 65° relative to the {0001} plane.

Further, as semiconductor layer 12, a layer such as a layer made of silicon carbide of n type having a lower n-type impurity concentration than substrate 11 for example may be used. Surface 12a of semiconductor layer 12 is also a crystal plane tilted at an angle in a range of not less than 50° and not more than 65° relative to the {0001} plane.

Further, as insulating film 13, a film such as an oxide film formed for example by dry oxidation (thermal oxidation) or the like may be used. Insulating film 13 is not limited to a single-layer structure, and may be of a structure including two or more layers.

Further, as second-conductive-type impurity diffusion layer 14, a layer such as a p-type region may be used that is formed by diffusing a p-type impurity serving as a second-conductive-type impurity in surface 12a of semiconductor layer 12, for example. Here, as the p-type impurity serving as a second-conductive-type impurity, aluminum, boron, or the like may be used, for example. Furthermore, in at least a part of a region excluding the region where first-conductive-type impurity diffusion layer 15 is formed in the surface of second-conductive-type impurity diffusion layer 14, a p+-type region containing a p-type impurity serving as a second-conductive-type impurity and having a higher concentration than second-conductive-type impurity diffusion layer 14 may be formed.

Further, as first-conductive-type impurity diffusion layer 15, a layer such as an n-type region that is formed by diffusing an n-type impurity serving as a first-conductive-type impurity in surface 12a of semiconductor layer 12 may be used, for example. The concentration of the n-type impurity as the first-conductive-type impurity in first-conductive-type impurity diffusion layer 15 may be made higher than the concentration of the n-type impurity as the first-conductive-type impurity in semiconductor layer 12. Here, as the n-type impurity serving as a first-conductive-type impurity, nitrogen, phosphorous or the like may be used, for example.

Further, for source electrode 16, gate electrode 17, and drain electrode 18 each, a conventionally known metal or the like may be used, for example.

In silicon carbide semiconductor device 1 shown in FIG. 1, a maximum value of the nitrogen concentration in a region within 10 nm from the interface between semiconductor layer 12 and insulating film 13 is not less than $1 \times 10^{21}$ cm$^{-3}$. Here, the region within 10 nm from the interface between semiconductor layer 12 and insulating film 13 refers to a region made up of: a region extending from the interface between semiconductor layer 12 and insulating film 13 perpendicularly to the interface toward semiconductor layer 12 side by 10 nm; and a region extending from the interface between semiconductor layer 12 and insulating film 13 perpendicularly to the interface toward insulating film 13 side by 10 nm.

Figure 2:
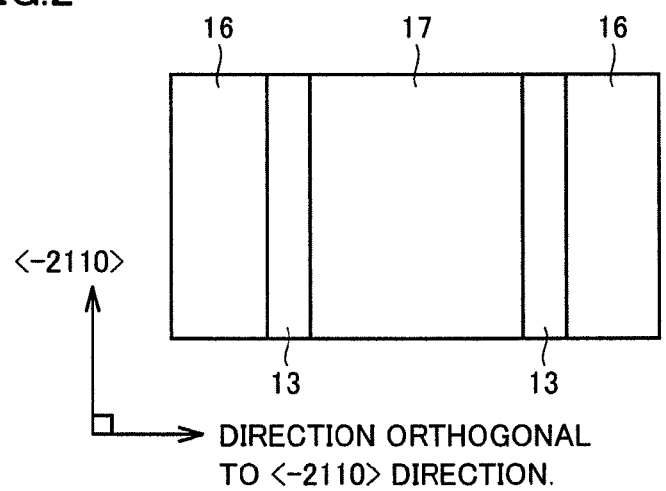
FIG. 2 is a schematic plan view of the silicon carbide semiconductor device shown in FIG. 1 as seen from a gate electrode side.

FIG. 2 shows a schematic plan view of silicon carbide semiconductor device 1 shown in FIG. 1 as seen from gate electrode 17 side. Here, the surface of source electrode 16 and the surface of gate electrode 17 are formed to extend in a stripe pattern in the <−2110> direction and, along the direction which is perpendicular to the <−2110> direction, source electrode 16 and gate electrode 17 are alternately arranged. One gate electrode 17 is disposed between two source electrodes 16. From a gap between source electrode 16 and gate electrode 17, a surface of insulating film 13 is exposed. Thus, where the surface of source electrode 16 has the stripe pattern, the channel direction tends to be set easily in a range of ±10° relative to the direction orthogonal to the <−2110> direction, in surface 12a of semiconductor layer 12 as will be described later herein. In the present invention, the channel direction means the direction in which carriers move in surface 12a of semiconductor layer 12.

Here, the channel direction of silicon carbide semiconductor device 1 with the above-described structure is set to be included in a range of ±10° relative to the direction orthogonal to the <−2110> direction, in surface 12a of semiconductor layer 12.

In the following, a description will be given of an example of the method of manufacturing silicon carbide semiconductor device 1 having the above-described structure. First, as shown in a schematic cross section of FIG. 3, substrate 11 made of silicon carbide (4H—SiC) having surface 11a formed of a crystal plane that is tilted at an angle in a range of not less than 50° and not more than 65° relative to the {0001} plane is prepared.

Figure 4:
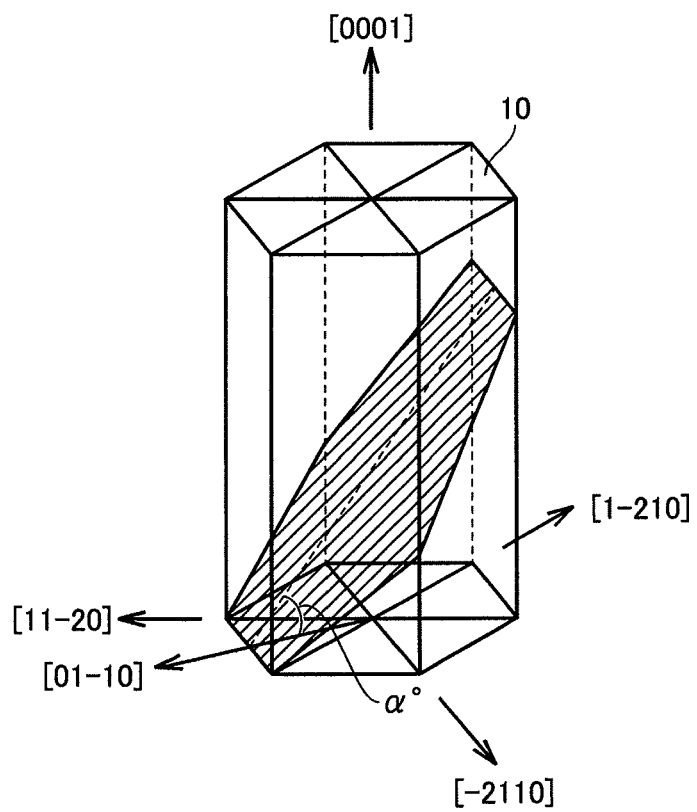
FIG. 4 is a schematic perspective view illustrating a part of the manufacturing process of an example of the method of manufacturing a silicon carbide semiconductor device of the present invention.

Here, substrate 11 having surface 11a as described above may be formed for example as shown in a schematic perspective view of FIG. 4, by slicing an n-type silicon carbide crystal ingot 10 which is a crystal grown in the [0001] direction (c-axis direction) to have an exposed {0001} plane, along the direction at an angle α° in a range of not less than 50° and not more than 65° relative to the {0001} plane, so that a crystal plane (hatched portion in FIG. 4) that is tilted at an angle in a range of not less than 50° and not more than 65° relative to the {0001} plane is exposed, for example.

Figure 5:
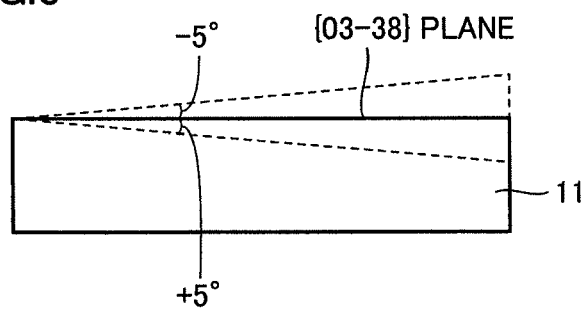
FIG. 5 is a schematic cross section of an example of the substrate used for the present invention.

Further, it is preferable that surface 11a of substrate 11 that is tilted at an angle in a range of not less than 50° and not more than 65° relative to the {0001} plane is also a crystal plane tilted at an angle in a range of ±5° relative to a {03-38} plane as shown for example in a schematic cross section of FIG. 5. In the case where surface 11a of substrate 11 is a crystal plane tilted at an angle in a range of ±5° relative to the {03-38} plane, electrical characteristics such as channel mobility of silicon carbide semiconductor device 1 tend to be improved. In order to further improve electrical characteristics such as channel mobility of silicon carbide semiconductor device 1, preferably surface 11a of substrate 11 is a crystal plane tilted at an angle in a range of ±3° relative to the {03-38} plane, and most preferably surface 11a of substrate 11 is the {03-38} plane. As is evident, a crystal plane tilted at an angle in a range of ±5° relative to the {03-38} plane and a crystal plane tilted at an angle in a range of ±3° relative to the {03-38} plane each include the {03-38} plane.

Figure 6:
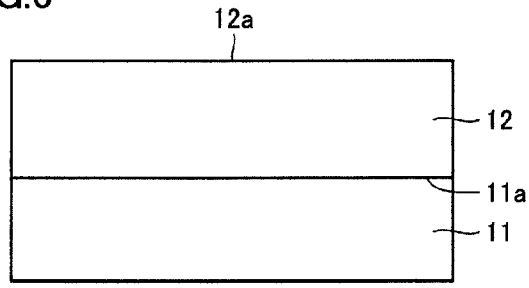
FIG. 6 is a schematic cross section illustrating a part of the manufacturing process of an example of the method of manufacturing a silicon carbide semiconductor device of the present invention.

Next, as shown in a schematic cross section of FIG. 6, semiconductor layer 12 is formed on surface 11a of substrate 11.

Here, semiconductor layer 12 may be formed for example by epitaxial growth or the like of semiconductor layer 12 made of n-type silicon carbide having an n-type impurity with a lower concentration than substrate 11, on surface 11a of substrate 11. Where semiconductor layer 12 is formed by the above-described epitaxial growth, surface 12a of semiconductor layer 12 is allowed to have the same crystal plane as surface 11a of substrate 11. Therefore, surface 12a of semiconductor layer 12 can be a crystal plane tilted at an angle in a range of not less than 50° and not more than 65° relative to the {0001} plane.

Further, for a similar reason to the above-described one, surface 12a of semiconductor layer 12 is preferably a crystal plane tilted at an angle in a range of ±5° relative to the {03-38} plane, more preferably a crystal plane tilted at an angle in a range of ±3° relative to the {03-38} plane, and most preferably the {03-38} plane. As is also evident here, a crystal plane tilted at an angle in a range of ±5° relative to the {03-38} plane and a crystal plane tilted at an angle in a range of ±3° relative to the {03-38} plane each include the {03-38} plane.

Figure 7:
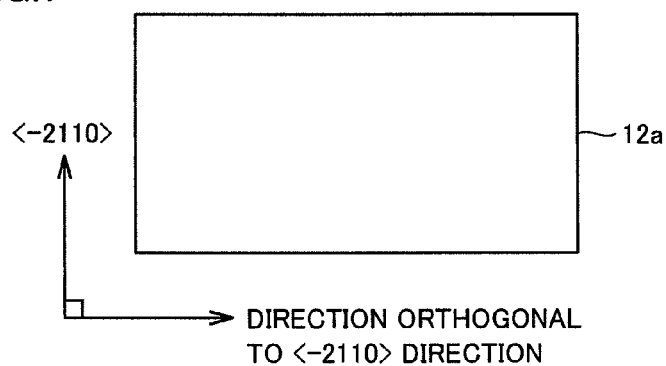
FIG. 7 is a schematic plan view of an example of a surface of a semiconductor layer used for the present invention.

Next, as shown in a schematic plan view of FIG. 7, the direction orthogonal to the <-2110> direction in surface 12a of semiconductor layer 12 is inspected.

Here, the direction orthogonal to the <-2110> direction in surface 12a of semiconductor layer 12 can be inspected based on a defect included in semiconductor layer 12 for example. Specifically, since a defect may be formed at a certain site of semiconductor layer 12 in a process of manufacturing silicon carbide semiconductor device 1, the direction orthogonal to the <-2110> direction in surface 12a of semiconductor layer 12 can be identified relative to the position of the defect formed at a certain site of semiconductor layer 12. Further, the direction orthogonal to the <-2110> direction in surface 12a of semiconductor layer 12 can also be identified based on the surface morphology of semiconductor layer 12.

Figure 8:
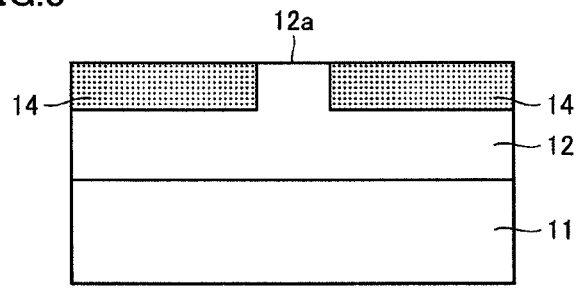
FIG. 8 is a schematic cross section illustrating a part of the manufacturing process of an example of the method of manufacturing a silicon carbide semiconductor device of the present invention.

Next, as shown in a schematic cross section of FIG. 8, second-conductive-type impurity diffusion layer 14 is formed in surface 12a of semiconductor layer 12. In this example, second-conductive-type impurity diffusion layer 14 is formed in a stripe pattern extending in the <-2110> direction. Second-conductive-type impurity diffusion layer 14, however, is not limited to this form.

Here, second-conductive-type impurity diffusion layer 14 may be formed for example by ion implantation or the like in which ions of a p-type impurity serving as a second-conductive-type impurity are implanted into surface 12a of semiconductor layer 12, after an ion implantation block mask is placed in a region other than the region where second-conductive-type impurity diffusion layer 14 is to be formed in surface 12a of semiconductor layer 12. As the ion implantation block mask, an oxide film or the like that has been patterned by photolithography and etching for example may be used.

Figure 9:
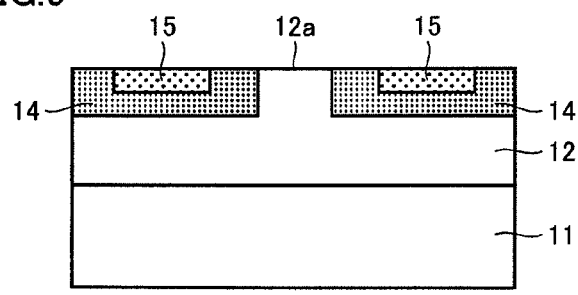
FIG. 9 is a schematic cross section illustrating a part of the manufacturing process of an example of the method of manufacturing a silicon carbide semiconductor device of the present invention.

Next, as shown in a schematic cross section of FIG. 9, first-conductive-type impurity diffusion layer 15 is formed in a surface of second-conductive-type impurity diffusion layer 14 formed in the above-described manner. In this example, first-conductive-type impurity diffusion layer 15 is also formed in a stripe pattern extending in the <-2110> direction. First-conductive-type impurity diffusion layer 15, however, is not limited to this form.

Here, first-conductive-type impurity diffusion layer 15 may be formed for example by ion implantation or the like in which ions of an n-type impurity serving as a first-conductive-type impurity are implanted into surface 12a of semiconductor layer 12, after an ion implantation block mask is placed in a region other than the region where first-conductive-type impurity diffusion layer 15 is to be formed in surface 12a of semiconductor layer 12. As the ion implantation block mask, an oxide film or the like that has been patterned by photolithography and etching for example may be used as well.

Next, an activation annealing treatment is performed on semiconductor layer 12 in which second-conductive-type impurity diffusion layer 14 and first-conductive-type impurity diffusion layer 15 have been formed in the above-described manner. Accordingly, the p-type impurity serving as a second-conductive-type impurity in second-conductive-type impurity diffusion layer 14 as well as the n-type impurity serving as a first-conductive-type impurity in first-conductive-type impurity diffusion layer 15 that have been introduced by the above-described ion implantation can be activated.

Here, the activation annealing treatment may be performed for example in an argon gas atmosphere by heating semiconductor layer 12 in which second-conductive-type impurity diffusion layer 14 and first-conductive-type impurity diffusion layer 15 have been formed, at a temperature of approximately 1700° C. for approximately 30 minutes, for example.

Figure 10:
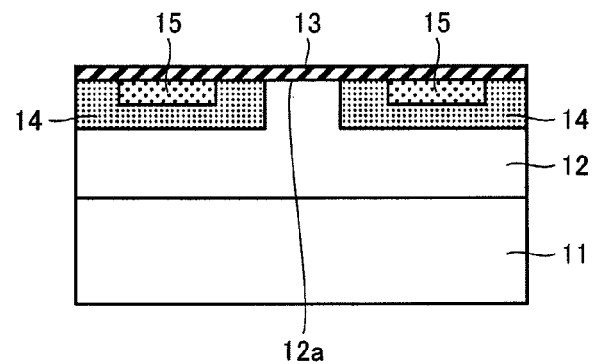
FIG. 10 is a schematic cross section illustrating a part of the manufacturing process of an example of the method of manufacturing a silicon carbide semiconductor device of the present invention.

Next, as shown in a schematic cross section of FIG. 10, insulating film 13 is formed to contact the whole of surface 12a of semiconductor layer 12 after second-conductive-type impurity diffusion layer 14 and first-conductive-type impurity diffusion layer 15 have been formed therein.

Here, as insulating film 13, an oxide film or the like formed for example by dry oxidation (thermal oxidation) or the like may be used. Dry oxidation (thermal oxidation) may be performed for example in air or oxygen by heating surface 12a of semiconductor layer 12 in which second-conductive-type impurity diffusion layer 14 and first-conductive-type impurity diffusion layer 15 have been formed in the above-described manner, at a temperature of approximately 1200° C. for approximately 30 minutes for example.

Next, a nitrogen annealing treatment is performed on semiconductor layer 12 on which above-described insulating film 13 has been formed. In this way, the nitrogen concentration is adjusted so that a maximum value of the nitrogen concentration in a region within 10 nm from the interface between semiconductor layer 12 and insulating film 13 is not less than $1 \times 10^{21}$ cm$^{-3}$.

Here, in the above-described nitrogen annealing treatment, semiconductor layer 12 on which above-described insulating film 13 has been formed is heated for example in an atmosphere of a gas containing nitrogen such as nitrogen monoxide (NO) gas at a temperature of approximately 1100° C. for approximately 120 minutes for example. In this way, a maximum value of the nitrogen concentration in the region within 10 nm from the interface between semiconductor layer 12 and insulating film 13 can be set to $1 \times 10^{21}$ cm$^{-3}$ or more.

It is preferable to further perform an inert gas annealing treatment on semiconductor layer 12 having undergone the above-described nitrogen annealing treatment, in an atmosphere of an inert gas such as argon gas for example. In the case where the above-described inert gas annealing treatment is performed on semiconductor layer 12 having undergone the above-described nitrogen annealing treatment, there is a higher tendency for silicon carbide semiconductor device 1 to be able to achieve a high channel mobility with high reproducibility.

Here, the above-described inert gas annealing treatment may be performed for example in an argon gas atmosphere by heating semiconductor layer 12 having undergone the above-described nitrogen annealing treatment, at a temperature of approximately 1100° C. for approximately 60 minutes for example.

Figure 11:
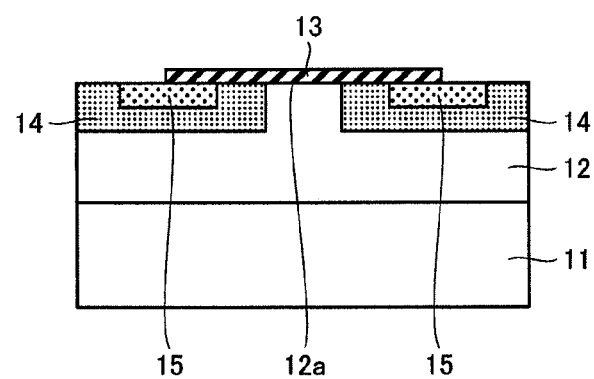
FIG. 11 is a schematic cross section illustrating a part of the manufacturing process of an example of the method of manufacturing a silicon carbide semiconductor device of the present invention.

Next, as shown in a schematic cross section of FIG. 11, a part of insulating film 13 formed as described above is removed to pattern insulating film 13.

Figure 12:
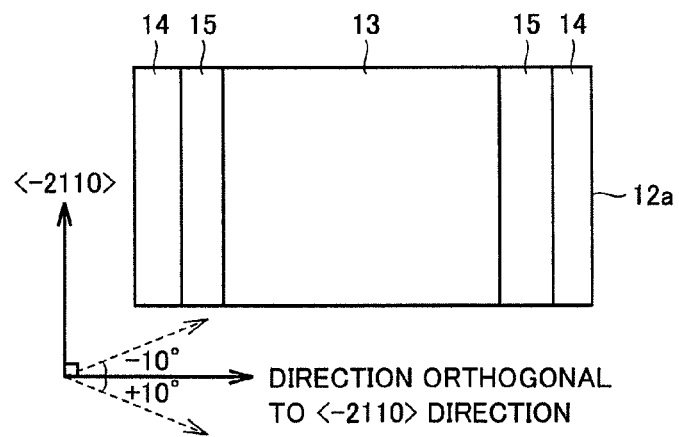
FIG. 12 is a schematic plan view illustrating a part of the manufacturing process of an example of the method of manufacturing a silicon carbide semiconductor device of the present invention.

Here, patterning of insulating film 13 is performed for example as shown in a schematic plan view of FIG. 12, so that the channel direction is included within a range of ±10° relative to the direction orthogonal to the <-2110> direction in surface 12a of semiconductor layer 12. Namely, patterning of insulating film 13 is performed so that the channel direction is parallel to any direction within a range from −10° relative to the direction orthogonal to the <−2110> direction to +10° relative to the direction orthogonal to the <−2110> direction, in surface 12a of semiconductor layer 12.

Further, a part of insulating film 13 may be removed for example by forming, on the surface of insulating film 13, an etching mask patterned by means of photolithography and etching for exposing a part to be removed of insulating film 13, for example, and thereafter etching and thereby removing the exposed part of insulating film 13.

Next, as shown in FIG. 1, source electrode 16 is formed to contact the exposed surface of first-conductive-type impurity diffusion layer 15 in surface 12a of semiconductor layer 12 that is exposed from the part where insulating film 13 has been removed.

Here, source electrode 16 may be formed for example by performing sputtering for example to form an electrically conductive film made of a metal such as nickel for example, on surface 12a of semiconductor layer 12 exposed after the above-described etching of insulating film 13 and on the surface of the above-described etching mask, and thereafter removing this etching mask. In other words, the conductive film formed on the surface of the etching mask is removed (lifted off) together with the etching mask while only the conductive film formed on surface 12a of semiconductor layer 12 is left to serve as source electrode 16.

Preferably, a heat treatment for achieving alloying is performed on semiconductor layer 12 on which above-described source electrode 16 has been formed.

Here, the heat treatment for achieving alloying may be performed for example in an atmosphere of an inert gas such as argon gas by heating semiconductor layer 12 on which above-described source electrode 16 has been formed, at a temperature of approximately 950° C. for approximately two minutes for example.

Next, as shown in FIG. 1, gate electrode 17 is formed on a surface of insulating film 13. Here, gate electrode 17 may be formed for example by performing photolithography and etching or the like to form a resist mask having an opening corresponding to a portion where gate electrode 17 is to be formed and covering respective entire surfaces of insulating film 13 and source electrode 16, then performing for example sputtering or the like to form an electrically conductive film made of a metal such as aluminum for example, on the surface of the resist mask and on the surface of insulating film 13 that is exposed from the opening of the resist mask, and thereafter removing this resist mask. In other words, the conductive film formed on the surface of the resist mask is removed (lifted off) together with the resist mask while only the conductive film formed on the surface of insulating film 13 is left to serve as gate electrode 17.

Next, as shown in FIG. 1, drain electrode 18 is formed on the back surface of substrate 11. Here, drain electrode 18 may be formed for example by performing for example sputtering or the like to form an electrically conductive film made of a metal such as nickel for example, on the back surface of substrate 11.

In this way, silicon carbide semiconductor device 1 with the structure shown in FIG. 1 can be manufactured.

Figure 13:
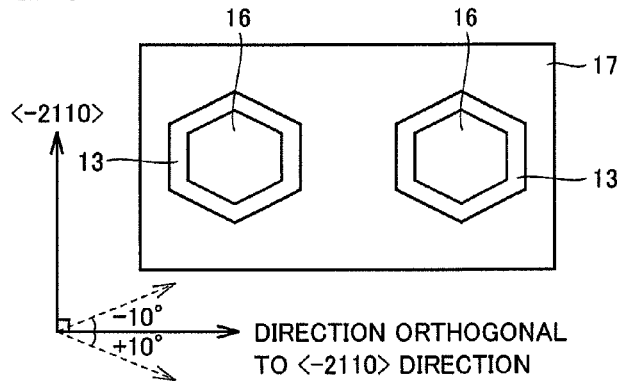
FIG. 13 is a schematic plan view of another example of the silicon carbide semiconductor device of the present invention as seen from a gate electrode side.

In silicon carbide semiconductor device 1 of the present invention, the surface of source electrode 16 may be formed in a honeycomb pattern and a region except for a partial region surrounding the outer periphery of source electrode 16 may be formed as gate electrode 17 as shown for example in a schematic plan view of FIG. 13.

In the case where the surface of source electrode 16 is formed in a honeycomb pattern as described above, the surface of each source electrode 16 is formed in the shape of a hexagon. In particular, the surface of source electrode 16 is preferably formed in the shape of a regular hexagon. In the case where each source electrode 16 has its surface formed in the shape of a regular hexagon, setting of the channel direction within a range of ±10° relative to the direction orthogonal to the <−2110> direction is facilitated, and the number of silicon carbide semiconductor devices 1 that can be formed from substrate 11 of the same size can be increased. Therefore, there is a tendency that silicon carbide semiconductor device 1 having a high channel mobility can be fabricated with higher reproducibility and at a higher manufacturing efficiency.

Other features of silicon carbide semiconductor device 1 having source electrode 16 and gate electrode 17 structured as shown in FIG. 13 may be similar to the above-described ones.

In silicon carbide semiconductor device 1 structured in the above-described manner, when a negative voltage is applied to source electrode 16 and a positive voltage is applied to gate electrode 17 and drain electrode 18 for example, carriers (electrons in the above-described example) injected from source electrode 16 move to drain electrode 18 through the surface of first-conductive-type impurity diffusion layer 15, the surface of second-conductive-type impurity diffusion layer 14, the inside of semiconductor layer 12, and the inside of substrate 11.

If a negative voltage is applied to source electrode 16 and a positive voltage is applied to drain electrode 18 while the positive voltage is not applied to gate electrode 17, carriers (electrons in the above-described example) injected from source electrode 16 can be restricted in movement in the surface of second-conductive-type impurity diffusion layer 14.

In silicon carbide semiconductor device 1 having the above-described structure, on surface 11a of substrate 11 tilted at an angle in a range of not less than 50° and not more than 65° relative to the {0001} plane of n-type silicon carbide (4H—SiC) for example, semiconductor layer 12 made of n-type silicon carbide containing an n-type impurity as the first-conductive-type impurity with a lower concentration than substrate 11 can be formed by epitaxial growth. In the case of this structure, surface 12a (crystal plane tilted at an angle in a range of not less than 50° and not more than 65° relative to the {0001} plane) of semiconductor layer 12 can be used for a channel in which carriers move. Therefore, as compared with the case where the {0001} plane is used for the channel, a higher carrier mobility (channel mobility) can be achieved.

Figure 14:
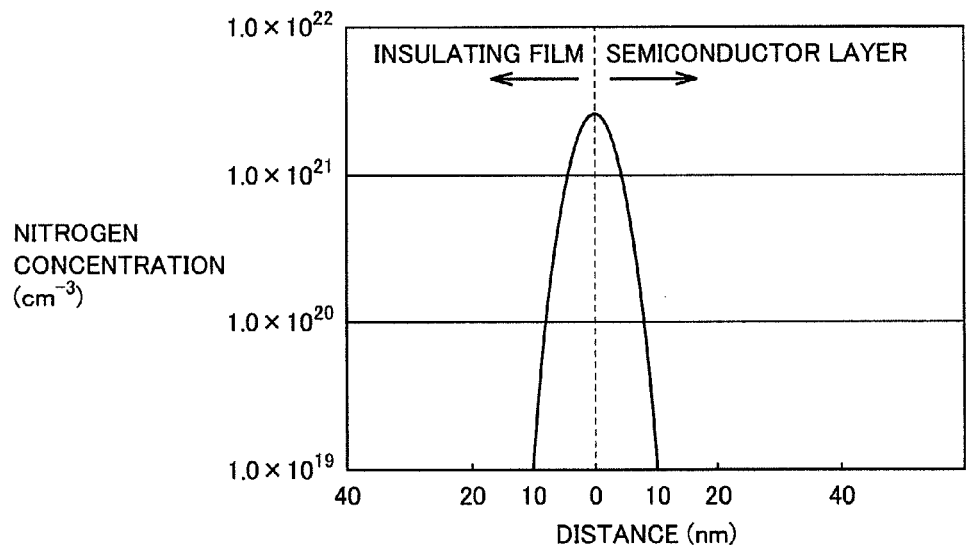
FIG. 14 is a diagram showing an example of a nitrogen concentration distribution in the vicinity of the interface between an insulating film and a semiconductor layer in an example of the silicon carbide semiconductor device of the present invention.

Further, in silicon carbide semiconductor device 1 having the above-described structure, a maximum value of the nitrogen concentration in a region within 10 nm from the interface between semiconductor layer 12 and insulating film 13 is not less than $1 \times 10^{21}$ cm$^{-3}$ as shown for example in FIG. 14. Therefore, in silicon carbide semiconductor device 1 of the present invention, the number of interface states that occur when insulating film 13 is formed by dry oxidation (thermal oxidation) or the like at the interface between semiconductor layer 12 and insulating film 13 can be reduced. Accordingly, particularly in a channel directly below insulating film 13 (the channel is located on the surface portions of second-conductive-type impurity diffusion layer 14 between first-conductive-type impurity diffusion layer 15 and semiconductor layer 12, which are also surface 12a of semiconductor layer 12 that contacts insulating film 13), the carrier mobility (channel mobility) can stably be improved.

FIG. 14 shows an example of the nitrogen concentration distribution in the vicinity of the interface between insulating film 13 and semiconductor layer 12 in silicon carbide semiconductor device 1 with the above-described structure. Here, in FIG. 14, the vertical axis represents the nitrogen concentration (cm$^{-3}$) and the horizontal axis represents the distance (nm) from the interface between insulating film 13 and semiconductor layer 12. Further, in FIG. 14, the portion where the distance (nm) on the horizontal axis is 0 (nm) represents the interface between insulating film 13 and semiconductor layer 12. The extension in the leftward direction with respect to the portion of 0 (nm) on the horizontal axis of the distance (nm) represents extension in the direction toward insulating film 13 side, while the extension in the rightward direction with respect to the portion of 0 (nm) on the horizontal axis of the distance (nm) represents extension in the direction toward semiconductor layer 12 side.

Further, silicon carbide semiconductor device 1 with the above-described structure has the channel direction in a range of ±10° relative to the direction orthogonal to the <−2110> direction in surface 12a of semiconductor layer 12. Carriers therefore move smoothly in this channel direction, and the carrier mobility in this channel direction and electric current characteristics can be improved. Accordingly, the ON resistance of silicon carbide semiconductor device 1 can be reduced.

Figure 15:
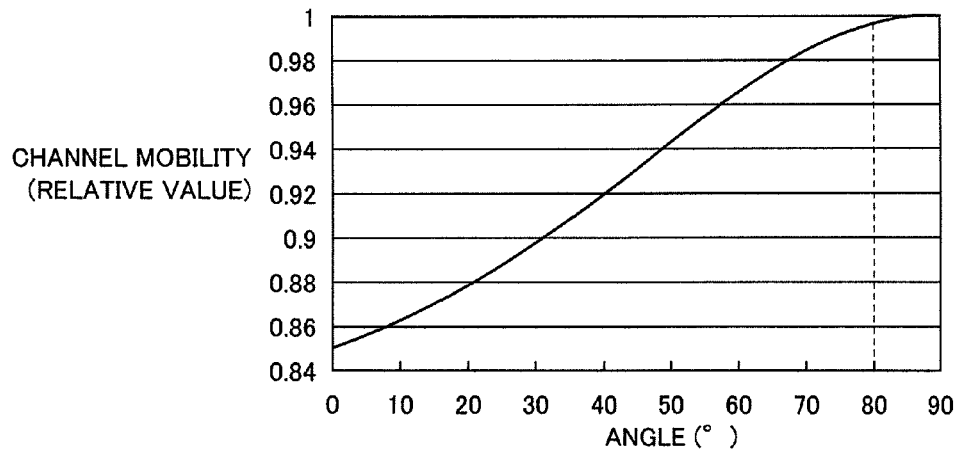
FIG. 15 is a diagram showing an example of the relation between an angle (°) relative to the <−2110> direction and a channel mobility (relative value) in a surface of a semiconductor layer in an example of the silicon carbide semiconductor device of the present invention.

FIG. 15 shows an example of the relation between the channel mobility (relative value) and the angle (°) relative to the <−2110> direction in surface 12a (in the crystal plane tilted at an angle in a range of not less than 50° and not more than 65° relative to the {0001} plane) of semiconductor layer 12 of silicon carbide semiconductor device 1 with the above-described structure. In FIG. 15, the vertical axis represents the channel mobility (relative value) and the horizontal axis represents the angle (°) relative to the <−2110> direction in surface 12a of semiconductor layer 12. As to the angle (°) on the horizontal axis in FIG. 15, the angle is not distinguished in terms of the direction of tilt relative to the <−2110> direction. Therefore, 80° on the horizontal axis for example represents both the direction tilted at +80° relative to the <−2110> direction and the direction tilted at −80° relative to the <−2110> direction.

The channel mobility (relative value) on the vertical axis in FIG. 15 is indicated by a relative value with respect to 1 of the channel mobility in the direction orthogonal to the <−2110> direction in surface 12a of semiconductor layer 12. Further, the portion where the angle (°) is 90° on the horizontal axis in FIG. 15 indicates the direction orthogonal to the <−2110> direction in surface 12a of semiconductor layer 12.

As shown in FIG. 15, it is seen that the channel mobility is highest when the channel direction extends in the direction at an angle of 90° relative to the <−2110> direction (the direction orthogonal to the <−2110> direction) in surface 12a of semiconductor layer 12, while the channel mobility tends to be smaller as a deviation is larger from the direction orthogonal to the <−2110> direction in surface 12a of semiconductor layer 12. The tendency seen from FIG. 15 is also satisfied by any crystal plane of surface 12a of semiconductor layer 12 that is tilted at an angle in a range of not less than 50° and not more than 65° relative to the {0001} plane.

Thus, in order to achieve a high channel mobility, it would be most preferable to have the channel direction orthogonal to the <−2110> direction in surface 12a of semiconductor layer 12 (namely the direction of ±0° orthogonal to the <−2110> direction).

However, as shown in FIG. 15, in the case where the channel direction is a direction at an angle of not less than 80° and not more than 90° relative to the <−2110> direction in surface 12a of semiconductor layer 12 (namely a direction in a range of ±10° relative to the direction orthogonal to the <−2110> direction), the channel mobility (relative value) is higher than 0.99. Therefore, even when the channel mobility of silicon carbide semiconductor device 1 varies to a certain extent, the channel mobility would be unlikely to deteriorate to a large extent.

As seen from the above, in silicon carbide semiconductor device 1 of the present invention having a channel direction in a range of ±10° relative to the direction orthogonal to the <−2110> direction in surface 12a of semiconductor layer 12, a high channel mobility can be achieved with high reproducibility. Further, in order to achieve a high channel mobility with high reproducibility in silicon carbide semiconductor device 1 of the present invention, it is most preferable that the channel direction is set in the direction orthogonal to the <−2110> direction in surface 12a of semiconductor layer 12 as described above.

While the above description refers to the n-type as the first conductive type and the p-type as the second conductive type, the present invention may be constructed so that the first conductive type is the p type and the second conductive type is the n type in the structure of the above-described silicon carbide semiconductor device 1.

Second Embodiment

Figure 16:
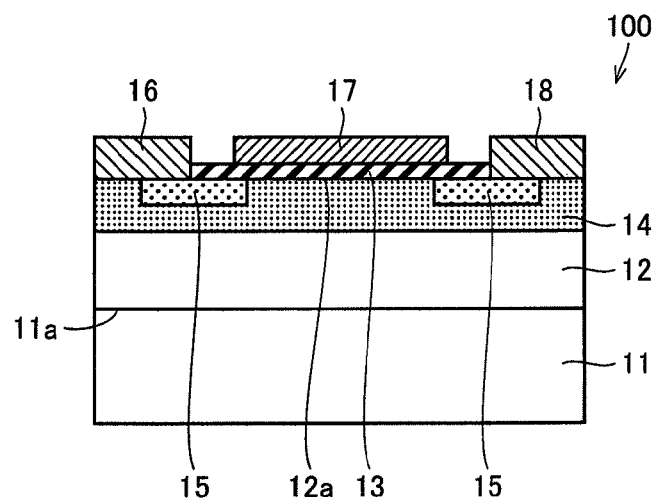
FIG. 16 is a schematic cross section of an example of a lateral MOSFET that is an example of the silicon carbide semiconductor device of the present invention.

FIG. 16 shows a schematic cross section of an example of a lateral MOSFET (Metal Oxide Semiconductor Field Effect Transistor) that is an example of the silicon carbide semiconductor device of the present invention.

A silicon carbide semiconductor device 100 shown in FIG. 16 includes a substrate 11 made of silicon carbide of n type and 4H—SiC polytype for example, a semiconductor layer 12 made of silicon carbide of n type formed on a surface 11a of substrate 11, a second-conductive-type impurity diffusion layer 14 that is a p-type region formed in a surface 12a of semiconductor layer 12, a first-conductive-type impurity diffusion layer 15 that is an n-type region formed in a surface of second-conductive-type impurity diffusion layer 14 (also in surface 12a of semiconductor layer 12), an insulating film 13 formed to contact surface 12a of semiconductor layer 12, a source electrode 16 and a drain electrode 18 formed in a region of surface 12a of semiconductor layer 12 other than a region where insulating film 13 is formed, and a gate electrode 17 formed on a surface of insulating film 13 on surface 12a of semiconductor layer 12.

Here again, surface 11a of substrate 11 on which semiconductor layer 12 is formed is a crystal plane tilted at an angle in a range of not less than 50° and not more than 65° relative to the {0001} plane. Further, surface 12a of semiconductor layer 12 is also a crystal plane tilted at an angle in a range of not less than 50° and not more than 65° relative to the {0001} plane.

Further, as insulating film 13, a film such as an oxide film formed for example by dry oxidation (thermal oxidation) or the like may be used. Insulating film 13 is not limited to a single-layer structure, and may be of a structure including two or more layers.

Further, as second-conductive-type impurity diffusion layer 14, a p-type region or the like may be used that is formed by diffusing a p-type impurity serving as a second-conductive-type impurity in surface 12a of semiconductor layer 12, for example. Furthermore, in at least a part of a region excluding the region where first-conductive-type impurity diffusion layer 15 is formed in the surface of second-conductive-type impurity diffusion layer 14, a p+-type region containing a p-type impurity serving as a second-conductive-type impurity and having a higher concentration than second-conductive-type impurity diffusion layer 14 may be formed.

Further, as first-conductive-type impurity diffusion layer 15, an n-type region or the like that is formed by diffusing an n-type impurity serving as a first-conductive-type impurity in surface 12a of semiconductor layer 12 may be used, for example. The concentration of the n-type impurity as the first-conductive-type impurity in first-conductive-type impurity diffusion layer 15 may be made higher than the concentration of the n-type impurity as the first-conductive-type impurity in semiconductor layer 12. Here, as the n-type impurity serving as a first-conductive-type impurity, nitrogen, phosphorous or the like may be used, for example.

In silicon carbide semiconductor device 100 shown in FIG. 16, a maximum value of the nitrogen concentration in a region within 10 nm from the interface between semiconductor layer 12 and insulating film 13 is also not less than $1 \times 10^{21}$ cm$^{-3}$. Here again, the region within 10 nm from the interface between semiconductor layer 12 and insulating film 13 refers to a region made up of: a region extending from the interface between semiconductor layer 12 and insulating film 13 perpendicularly to the interface toward semiconductor layer 12 side by 10 nm; and a region extending from the interface between semiconductor layer 12 and insulating film 13 perpendicularly to the interface toward insulating film 13 side by 10 nm.

Figure 17:
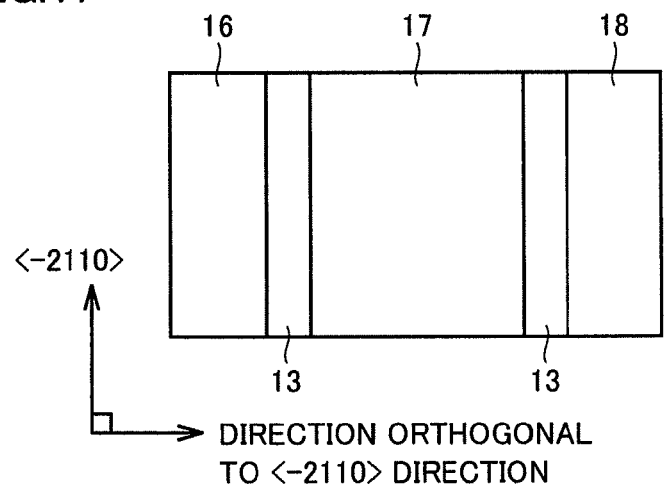
FIG. 17 is a schematic plan view of the silicon carbide semiconductor device shown in FIG. 16 as seen from a gate electrode side.

FIG. 17 shows a schematic plan view of silicon carbide semiconductor device 100 shown in FIG. 16 as seen from gate electrode 17 side. Here, the surface of source electrode 16, the surface of gate electrode 17, and the surface of drain electrode 18 are each formed to extend in a stripe pattern in the <-2110> direction and, along the direction which is perpendicular to the <-2110> direction, source electrode 16, gate electrode 17, and drain electrode 18 are arranged in this order.

Further, one gate electrode 17 is disposed between source electrode 16 and drain electrode 18. From each of a gap between source electrode 16 and gate electrode 17 and a gap between gate electrode 17 and drain electrode 18, a surface of insulating film 13 is exposed.

Thus, in the case where the surface of source electrode 16, the surface of gate electrode 17, and the surface of drain electrode 18 form the stripe pattern, the channel direction tends to be set easily in a range of ±10° relative to the direction orthogonal to the <-2110> direction, in surface 12a of semiconductor layer 12 as will be described later herein. In the present invention, the channel direction means the direction in which carriers move in surface 12a of semiconductor layer 12.

Here again, the channel direction of silicon carbide semiconductor device 100 with the above-described structure is set to be included in a range of ±10° relative to the direction orthogonal to the <-2110> direction, in surface 12a of semiconductor layer 12.

In the following, a description will be given of an example of the method of manufacturing silicon carbide semiconductor device 100 having the above-described structure. First, as shown in a schematic cross section of FIG. 3, substrate 11 made of silicon carbide (4H—SiC) having surface 11a formed of a crystal plane that is tilted at an angle in a range of not less than 50° and not more than 65° relative to the {0001} plane is prepared.

Here, substrate 11 having surface 11a as described above may be formed for example as shown in a schematic perspective view of FIG. 4, by slicing an n-type silicon carbide crystal ingot 10 which is a crystal grown in the [0001] direction (c-axis direction) to have an exposed {0001} plane, along the direction at an angle α° in a range of not less than 50° and not more than 65° relative to the {0001} plane, so that a crystal plane (hatched portion in FIG. 4) that is tilted at an angle in a range of not less than 50° and not more than 65° relative to the {0001} plane is exposed, for example.

Further, it is preferable that surface 11a of substrate 11 that is tilted at an angle in a range of not less than 50° and not more than 65° relative to the {0001} plane is also a crystal plane tilted at an angle in a range of ±5° relative to a {03-38} plane as shown for example in a schematic cross section of FIG. 5. In the case where surface 11a of substrate 11 is a crystal plane tilted at an angle in a range of ±5° relative to the {03-38} plane, electrical characteristics such as channel mobility of silicon carbide semiconductor device 100 tend to be improved. In order to further improve electrical characteristics such as channel mobility of silicon carbide semiconductor device 100, preferably surface 11a of substrate 11 is a crystal plane tilted at an angle in a range of ±3° relative to the {03-38} plane, and most preferably surface 11a of substrate 11 is the {03-38} plane. As is evident, a crystal plane tilted at an angle in a range of ±5° relative to the {03-38} plane and a crystal plane tilted at an angle in a range of ±3° relative to the {03-38} plane each include the {03-38} plane.

Next, as shown in a schematic cross section of FIG. 6, semiconductor layer 12 is formed on surface 11a of substrate 11.

Here, semiconductor layer 12 may be formed for example by epitaxial growth or the like of semiconductor layer 12 made of n-type silicon carbide having an n-type impurity with a lower concentration than substrate 11, on surface 11a of substrate 11. Where semiconductor layer 12 is formed by the above-described epitaxial growth, surface 12a of semiconductor layer 12 is allowed to have the same crystal plane as surface 11a of substrate 11. Therefore, surface 12a of semiconductor layer 12 can be a crystal plane tilted at an angle in a range of not less than 50° and not more than 65° relative to the {0001} plane.

Further, for a similar reason to the above-described one, surface 12a of semiconductor layer 12 is preferably a crystal plane tilted at an angle in a range of ±5° relative to the {03-38} plane, more preferably a crystal plane tilted at an angle in a range of ±3° relative to the {03-38} plane, and most preferably the {03-38} plane. As is also evident here, a crystal plane tilted at an angle in a range of ±5° relative to the {03-38} plane and a crystal plane tilted at an angle in a range of ±3° relative to the {03-38} plane each include the {03-38} plane.

Next, as shown in a schematic plan view of FIG. 7, the direction orthogonal to the <-2110> direction in surface 12a of semiconductor layer 12 is inspected.

Here, the direction orthogonal to the <-2110> direction in surface 12a of semiconductor layer 12 can be inspected based on a defect included in semiconductor layer 12 for example. Specifically, since a defect may be formed at a certain site of semiconductor layer 12 in a process of manufacturing silicon carbide semiconductor device 100, the direction orthogonal to the <-2110> direction in surface 12a of semiconductor layer 12 can be identified relative to the position of the defect formed at a certain site of semiconductor layer 12. Further, the direction orthogonal to the <-2110> direction in surface 12a of semiconductor layer 12 can also be identified based on the surface morphology of semiconductor layer 12.

Figure 18:
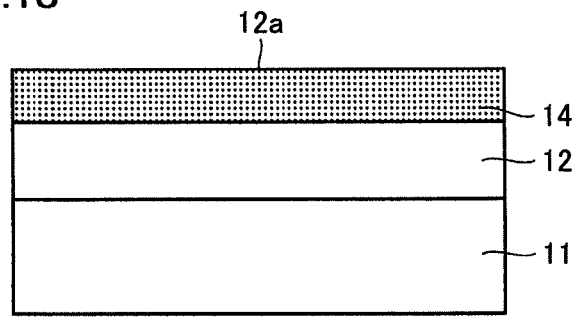
FIG. 18 is a schematic cross section illustrating a part of a manufacturing process of an example of the method of manufacturing a silicon carbide semiconductor device of the present invention.

Next, as shown in a schematic cross section of FIG. 18, second-conductive-type impurity diffusion layer 14 is formed in the whole of surface 12a of semiconductor layer 12.

Figure 19:
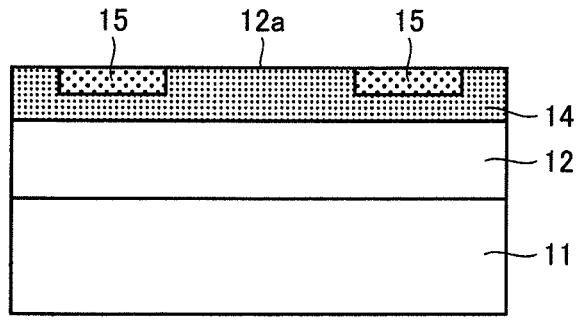
FIG. 19 is a schematic cross section illustrating a part of the manufacturing process of an example of the method of manufacturing a silicon carbide semiconductor device of the present invention.

Next, as shown in a schematic cross section of FIG. 19, first-conductive-type impurity diffusion layer 15 is formed in a part of a surface of second-conductive-type impurity diffusion layer 14 formed in the above-described manner. In this example, first-conductive-type impurity diffusion layer 15 is also formed in a stripe pattern extending in the <–2110> direction. First-conductive-type impurity diffusion layer 15, however, is not limited to this form.

Here, first-conductive-type impurity diffusion layer 15 may be formed for example by ion implantation or the like in which ions of an n-type impurity serving as a first-conductive-type impurity are implanted into surface 12a of semiconductor layer 12, after an ion implantation block mask is placed in a region other than the region where first-conductive-type impurity diffusion layer 15 is to be formed in surface 12a of semiconductor layer 12. As the ion implantation block mask, an oxide film or the like that has been patterned by photolithography and etching for example may be used as well.

Next, an activation annealing treatment is performed on semiconductor layer 12 in which second-conductive-type impurity diffusion layer 14 and first-conductive-type impurity diffusion layer 15 have been formed in the above-described manner. Accordingly, the p-type impurity serving as a second-conductive-type impurity in second-conductive-type impurity diffusion layer 14 as well as the n-type impurity serving as a first-conductive-type impurity in first-conductive-type impurity diffusion layer 15 that have been introduced by the above-described ion implantation can be activated.

Here, the activation annealing treatment may be performed for example in an argon gas atmosphere by heating semiconductor layer 12 in which second-conductive-type impurity diffusion layer 14 and first-conductive-type impurity diffusion layer 15 have been formed, at a temperature of approximately 1700° C. for approximately 30 minutes, for example.

Figure 20:
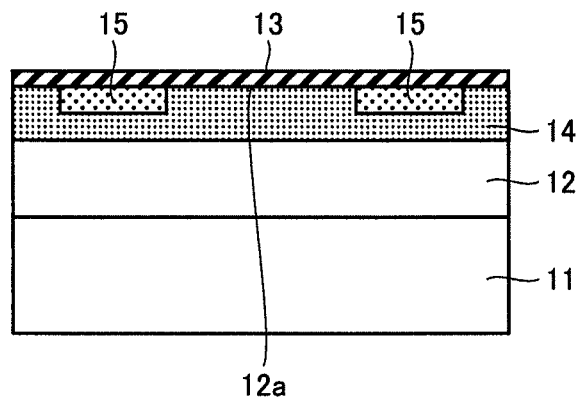
FIG. 20 is a schematic cross section illustrating a part of the manufacturing process of an example of the method of manufacturing a silicon carbide semiconductor device of the present invention.

Next, as shown in a schematic cross section of FIG. 20, insulating film 13 is formed to contact the whole of surface 12a of semiconductor layer 12 after second-conductive-type impurity diffusion layer 14 and first-conductive-type impurity diffusion layer 15 have been formed therein.

Here, as insulating film 13, an oxide film or the like formed for example by dry oxidation (thermal oxidation) or the like may be used. Dry oxidation (thermal oxidation) may be performed for example in air or oxygen by heating surface 12a of semiconductor layer 12 in which second-conductive-type impurity diffusion layer 14 and first-conductive-type impurity diffusion layer 15 have been formed in the above-described manner, at a temperature of approximately 1200° C. for approximately 30 minutes for example.

Next, a nitrogen annealing treatment is performed on semiconductor layer 12 on which above-described insulating film 13 has been formed. In this way, the nitrogen concentration is adjusted so that a maximum value of the nitrogen concentration in a region within 10 nm from the interface between semiconductor layer 12 and insulating film 13 is not less than $1 \times 10^{21}$ cm$^{-3}$.

Here, in the above-described nitrogen annealing treatment, semiconductor layer 12 on which above-described insulating film 13 has been formed is heated for example in an atmosphere of a gas containing nitrogen such as nitrogen monoxide (NO) gas at a temperature of approximately 1100° C. for approximately 120 minutes for example. In this way, a maximum value of the nitrogen concentration in the region within 10 nm from the interface between semiconductor layer 12 and insulating film 13 can be set to $1 \times 10^{21}$ cm$^{-3}$ or more.

It is preferable to further perform an inert gas annealing treatment on semiconductor layer 12 having undergone the above-described nitrogen annealing treatment, in an atmosphere of an inert gas such as argon gas for example. In the case where the above-described inert gas annealing treatment is performed on semiconductor layer 12 having undergone the above-described nitrogen annealing treatment, there is a higher tendency for silicon carbide semiconductor device 100 to be able to achieve a high channel mobility with high reproducibility.

Here, the above-described inert gas annealing treatment may be performed for example in an argon gas atmosphere by heating semiconductor layer 12 having undergone the above-described nitrogen annealing treatment, at a temperature of approximately 1100° C. for approximately 60 minutes for example.

Figure 21:
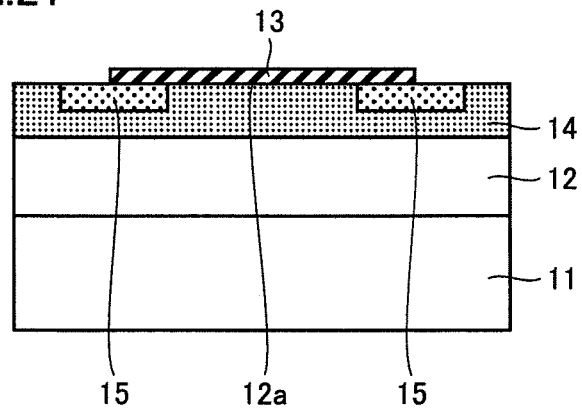
FIG. 21 is a schematic cross section illustrating a part of the manufacturing process of an example of the method of manufacturing a silicon carbide semiconductor device of the present invention.

Next, as shown in a schematic cross section of FIG. 21, a part of insulating film 13 formed as described above is removed to pattern insulating film 13.

Here, patterning of insulating film 13 is performed for example as shown in a schematic plan view of FIG. 12, so that the channel direction is included within a range of ±10° relative to the direction orthogonal to the <–2110> direction in surface 12a of semiconductor layer 12. Namely, patterning of insulating film 13 is performed so that the channel direction is parallel to any direction within a range from –10° relative to the direction orthogonal to the <–2110> direction to +10° relative to the direction orthogonal to the <–2110> direction, in surface 12a of semiconductor layer 12.

Further, a part of insulating film 13 may be removed for example by forming, on the surface of insulating film 13, an etching mask patterned by means of photolithography and etching for exposing a part to be removed of insulating film 13, for example, and thereafter etching and thereby removing the exposed part of insulating film 13.

Next, as shown in FIG. 16, source electrode 16 and drain electrode 18 are formed to contact the surface of first-conductive-type impurity diffusion layer 15 in surface 12a of semiconductor layer 12 that is exposed from the part where insulating film 13 has been removed.

Here, source electrode 16 and drain electrode 18 may be formed for example by performing sputtering for example to form an electrically conductive film made of a metal such as nickel for example, on surface 12a of semiconductor layer 12 exposed after the above-described etching of insulating film 13 and on the surface of the above-described etching mask, and thereafter removing this etching mask. In other words, the conductive film formed on the surface of the etching mask is removed (lifted off) together with the etching mask while only the conductive film formed on surface 12a of semiconductor layer 12 is left to serve as source electrode 16 and drain electrode 18.

Preferably, a heat treatment for achieving alloying is performed on semiconductor layer 12 on which above-described source electrode 16 and drain electrode 18 have been formed.

Here, the heat treatment for achieving alloying may be performed for example in an atmosphere of an inert gas such as argon gas by heating semiconductor layer 12 on which above-described source electrode 16 and drain electrode 18 been formed, at a temperature of approximately 950° C. for approximately two minutes for example.

Next, as shown in FIG. 16, gate electrode 17 is formed on a surface of insulating film 13. Here, gate electrode 17 may be formed for example by performing photolithography and etching or the like to form a resist mask having an opening corresponding to a portion where gate electrode 17 is to be formed and covering respective entire surfaces of insulating film 13, source electrode 16, and drain electrode 18, then performing for example sputtering or the like to form an electrically conductive film made of a metal such as aluminum for example, on the surface of the resist mask and on the surface of insulating film 13 that is exposed from the opening of the resist mask, and thereafter removing this resist mask. In other words, the conductive film formed on the surface of the resist mask is removed (lifted off) together with the resist mask while only the conductive film formed on the surface of insulating film 13 is left to serve as gate electrode 17.

In this way, silicon carbide semiconductor device 100 with the structure shown in FIG. 16 can be manufactured.

In silicon carbide semiconductor device 100 structured in the above-described manner, when a negative voltage is applied to source electrode 16 and a positive voltage is applied to gate electrode 17 and drain electrode 18 for example, carriers (electrons in the above-described example) injected from source electrode 16 move to drain electrode 18 through the surface of first-conductive-type impurity diffusion layer 15 on the source electrode 16 side, the surface of second-conductive-type impurity diffusion layer 14, and the surface of first-conductive-type impurity diffusion layer 15 on the drain electrode 18 side.

If a negative voltage is applied to source electrode 16 and a positive voltage is applied to drain electrode 18 while the positive voltage is not applied to gate electrode 17, carriers (electrons in the above-described example) injected from source electrode 16 can be restricted in movement in the surface of second-conductive-type impurity diffusion layer 14.

In silicon carbide semiconductor device 100 having the above-described structure, on surface 11a of substrate 11 tilted at an angle in a range of not less than 50° and not more than 65° relative to the {0001} plane of n-type silicon carbide (4H—SiC) for example, semiconductor layer 12 made of n-type silicon carbide containing an n-type impurity as the first-conductive-type impurity with a lower concentration than substrate 11 can be formed by epitaxial growth. In the case of this structure, surface 12a (crystal plane tilted at an angle in a range of not less than 50° and not more than 65° relative to the {0001} plane) of semiconductor layer 12 can be used for a channel in which carriers move. Therefore, as compared with the case where the {0001} plane is used for the channel, a higher carrier mobility (channel mobility) can be achieved.

Further, in silicon carbide semiconductor device 100 having the above-described structure, a maximum value of the nitrogen concentration in a region within 10 nm from the interface between semiconductor layer 12 and insulating film 13 is not less than $1 \times 10^{21}$ cm$^{-3}$ as shown for example in FIG. 14. Therefore, in silicon carbide semiconductor device 100 of the present invention, the number of interface states that occur when insulating film 13 is formed by dry oxidation (thermal oxidation) or the like at the interface between semiconductor layer 12 and insulating film 13 can be reduced. Accordingly, particularly in a channel directly below insulating film 13 (the portion of surface 12a of semiconductor layer 12 that contacts insulating film 13 (the surface portion of second-conductive-type impurity diffusion layer 14), the carrier mobility (channel mobility) can stably be improved.

Further, silicon carbide semiconductor device 100 with the above-described structure has the channel direction in a range of ±10° relative to the direction orthogonal to the <-2110> direction in surface 12a of semiconductor layer 12. Carriers therefore move smoothly in this channel direction, and the carrier mobility in this channel direction and electric current characteristics can be improved. Accordingly, the ON resistance of silicon carbide semiconductor device 100 can be reduced.

As shown in FIG. 15 for example, in silicon carbide semiconductor device 100 having the above-described structure, the channel mobility is also highest when the channel direction extends in the direction at an angle of 90° relative to the <-2110> direction (the direction orthogonal to the <-2110> direction) in surface 12a of semiconductor layer 12, while the channel mobility tends to be smaller as a deviation is larger from the direction orthogonal to the <-2110> direction in surface 12a of semiconductor layer 12.

Thus, in order to achieve a high channel mobility in silicon carbide semiconductor device 100 having the above-described structure as well, it would be most preferable to have the channel direction orthogonal to the <-2110> direction in surface 12a of semiconductor layer 12 (namely the direction of ±0° orthogonal to the <-2110> direction).

However, as shown in FIG. 15, in silicon carbide semiconductor device 100 having the above-described structure, in the case where the channel direction is a direction at an angle of not less than 80° and not more than 90° relative to the <-2110> direction in surface 12a of semiconductor layer 12 (namely a direction in a range of ±10° relative to the direction orthogonal to the <-2110> direction), the channel mobility (relative value) is higher than 0.99. Therefore, even when the channel mobility of silicon carbide semiconductor device 100 varies to a certain extent, the channel mobility would be unlikely to deteriorate to a large extent.

As seen from the above, in silicon carbide semiconductor device 100 of the present invention having a channel direction in a range of ±10° relative to the direction orthogonal to the <-2110> direction in surface 12a of semiconductor layer 12, a high channel mobility can be achieved with high reproducibility. Further, in order to achieve a high channel mobility with high reproducibility in silicon carbide semiconductor device 100 of the present invention, it is most preferable that the channel direction is set in the direction orthogonal to the <-2110> direction in surface 12a of semiconductor layer 12 as described above.

In the present embodiment as well, while the above description refers to the n type as the first conductive type and the p type as the second conductive type, the present invention may be constructed so that the first conductive type is the p type and the second conductive type is the n type in the structure of the above-described silicon carbide semiconductor device 100.

Further, the description of the present embodiment other than the description above is similar to that of the first embodiment, and will therefore not be repeated.

EXAMPLES

Example 1

Fabrication of Vertical DiMOSFET

A silicon carbide semiconductor device was fabricated as a vertical DiMOSFET of an Example in the following way.

Figure 3:
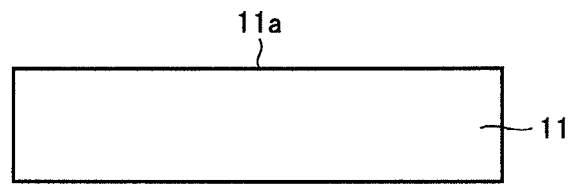
FIG. 3 is a schematic cross section illustrating a part of a manufacturing process of an example of the method of manufacturing a silicon carbide semiconductor device of the present invention.

First, as shown in FIG. 3, substrate 11 formed of an n-type silicon carbide crystal (4H—SiC) with a thickness of 400 μm was prepared. Here, substrate 11 has, as surface 11a, a {03-38} plane that is a crystal plane tilted at an angle of approximately 55° relative to the {0001} plane.

Next, as shown in FIG. 6, semiconductor layer 12 (n-type impurity concentration: $5 \times 10^{15}$ cm$^{-3}$) formed of an n-type silicon carbide crystal doped with nitrogen as an n-type impurity was epitaxially grown to a thickness of 10 μm on surface 11a of substrate 11 by means of CVD (Chemical Vapor Deposition).

Next, as shown in FIG. 7, the direction orthogonal to the <-2110> direction in surface 12a of semiconductor layer 12 was inspected. Here, the direction orthogonal to the <-2110> direction in surface 12a of semiconductor layer 12 was identified based on a defect formed in semiconductor layer 12.

Next, as shown in FIG. 8, second-conductive-type impurity diffusion layer 14 (p-type impurity concentration: $1\times10^{17}$ $cm^{-3}$) was formed in surface 12a of semiconductor layer 12. Here, second-conductive-type impurity diffusion layer 14 was formed by using photolithography and etching to form a patterned oxide film in a region other than the region where second-conductive-type impurity diffusion layer 14 was to be formed in surface 12a of semiconductor layer 12, and implanting ions of boron as a p-type impurity using the oxide film as an ion implantation block mask. Second-conductive-type impurity diffusion layer 14 was formed so that the surface of second-conductive-type impurity diffusion layer 14 had the shape of a regular hexagon.

Next, as shown in FIG. 9, in a surface of second-conductive-type impurity diffusion layer 14 formed in the above-described manner, first-conductive-type impurity diffusion layer 15 (n-type impurity concentration: $5\times10^{19}$ $cm^{-3}$) and a p+-type region (not shown) (p-type impurity concentration: $3\times10^{19}$ $cm^{-3}$) were formed. Here, first-conductive-type impurity diffusion layer 15 was formed so that the surface of first-conductive-type impurity diffusion layer 15 had the shape of a regular hexagon, and the p+-type region was formed so that it abutted on the side of first-conductive-type impurity diffusion layer 15 opposite to the side where a channel was formed. First-conductive-type impurity diffusion layer 15 was formed by using photolithography and etching to form a patterned oxide film in a region other than the region where first-conductive-type impurity diffusion layer 15 was to be formed in surface 12a of semiconductor layer 12, and implanting ions of phosphorous as an n-type impurity using the oxide film as an ion implantation block mask. The p+-type region was also formed by using photolithography and etching to form a patterned oxide film in a region other than the region where the p+-type region was to be formed in surface 12a of semiconductor layer 12, and implanting ions of boron as a p-type impurity using the oxide film as an ion implantation block mask.

Next, an activation annealing treatment was performed by heating semiconductor layer 12 in which second-conductive-type impurity diffusion layer 14, first-conductive-type impurity diffusion layer 15, and the p+-type region were formed in the above-described manner, in an argon gas atmosphere at 1700° C. for 30 minutes.

Next, as shown in FIG. 10, surface 12a of semiconductor layer 12 was heated in oxygen at 1200° C. for 30 minutes to be dry-oxidized (thermally oxidized) and thereby form insulating film 13 contacting the whole of surface 12a of semiconductor layer 12.

Next, a nitrogen annealing treatment was performed by heating semiconductor layer 12 on which insulating film 13 had been formed, in a nitrogen monoxide (NO) gas atmosphere at 1100° C. for 120 minutes.

Next, an inert gas annealing treatment was performed by heating semiconductor layer 12 having undergone the above-described nitrogen annealing treatment, in an argon gas atmosphere at 1100° C. for 60 minutes.

Next, insulating film 13 was patterned by removing a part of insulating film 13 formed in the above-described manner, so that the channel direction is the direction orthogonal to the <-2110> direction in surface 12a of semiconductor layer 12. Here, patterning of insulating film 13 was performed by forming, on the surface of insulating film 13, an etching mask patterned by photolithography and etching in order to expose a part-to-be-removed of insulating film 13, and thereafter etching and thereby removing the exposed part of insulating film 13.

Next, on the surface of first-conductive-type impurity diffusion layer 15 and the surface of the p+-type region (not shown) that had been exposed from the portion where insulating film 13 was removed, source electrode 16 was formed that was made of nickel and having its surface in the shape of a regular hexagon as shown in FIG. 13 and a thickness of 0.1 μm.

Next, semiconductor layer 12 on which above-described source electrode 16 had been formed was heat-treated for alloying, by being heated in an argon gas atmosphere at 950° C. for two minutes.

Next, on the surface of insulating film 13, gate electrode 17 was formed that was made of aluminum and having a surface shape as shown in FIG. 13 and a thickness of 1 μm.

Next, on the whole of the rear surface of substrate 11, drain electrode 18 of nickel with a thickness of 0.1 μm was formed.

In this way, silicon carbide semiconductor device 1 was fabricated as a vertical DiMOSFET of the Example.

Silicon carbide semiconductor device 1 to serve as a vertical DiMOSFET of the Example fabricated in the above-described manner had a channel length (the distance between first-conductive-type impurity diffusion layer 15 and semiconductor layer 12, between source electrodes 16 adjacent to each other in surface 12a of semiconductor layer 12) of 2 μm.

Further, for comparison's sake, a silicon carbide semiconductor device to serve as a vertical DiMOSFET of a Comparative Example was fabricated in a manner similar to the above-described one, except that the channel direction was the <-2110> direction in surface 12a of semiconductor layer 12.

Evaluation of Vertical DiMOSFET

For the vertical DiMOSFETs of the Example and the Comparative Example fabricated in the above-described manner, the distribution, in the depth direction, of the nitrogen concentration in the vicinity of the interface between semiconductor layer 12 and insulating film 13 was measured by SIMS (secondary ion mass spectrometry).

As a result, it was found that the maximum value of the nitrogen concentration in the vicinity of the interface between semiconductor layer 12 and insulating film 13 was $1\times10^{21}$ $cm^{-3}$ or more in both respective vertical DiMOSFETs of the Example and the Comparative Example. It was thus confirmed that the maximum value of the nitrogen concentration in a region within 10 nm from the interface between semiconductor layer 12 and insulating film 13 was not less than $1\times10^{21}$ $cm^{-3}$ in each of respective vertical DiMOSFETs of the Example and the Comparative Example.

Further, for the vertical DiMOSFETs of the Example and the Comparative Example, the channel mobility was evaluated. For evaluating the channel mobility, the following method was used. First, under the condition that the source-drain voltage was VDS=0.1 V, a gate voltage VG was applied to measure a source-drain current IDS (to measure the gate voltage dependency). Then, Expression (1) below where gm=(δIDS)/(δVG) was used to determine the maximum value of the channel mobility for the gate voltage, and the maximum value was calculated as the channel mobility.

$$\text{Channel mobility } \mu = gm \times (L \times d)/(W \times \varepsilon \times VDS) \quad (1)$$

In Expression (1) above, L represents the channel length, d represents the thickness of insulating film 13, W represents the channel width, and ∈ represents the dielectric constant of insulating film 13.

Consequently, it was found that the channel mobility of the vertical DiMOSFET of the Example was 80 cm$^2$/Vs and the channel mobility of the vertical DiMOSFET of the Comparative Example was 70 cm$^2$/Vs.

As seen from the above, the channel mobility of the vertical DiMOSFET of the Example was about 1.14 times as high as the channel mobility of the vertical DiMOSFET of the Comparative Example, and accordingly the source-drain current value was 1.14 times. Thus, a significant reduction in ON resistance was confirmed.

It is therefore considered that in the structure of the vertical DiMOSFET of the Example, the channel mobility is unlikely to considerably decrease even when the channel mobility varies to a certain extent depending on problems in manufacture, and thus a high channel mobility can be achieved with high reproducibility.

Example 2

Fabrication of Lateral MOSFET

A silicon carbide semiconductor device was fabricated as a lateral MOSFET of this Example in the following way.

First, as shown in FIG. 3, substrate 11 formed of an n-type silicon carbide crystal (4H—SiC) with a thickness of 400 μm was prepared. Here, substrate 11 has, as surface 11a, a {03-38} plane that is a crystal plane tilted at an angle of approximately 55° relative to the {0001} plane.

Next, as shown in FIG. 6, semiconductor layer 12 (n-type impurity concentration: 5×10$^{15}$ cm$^{-3}$) formed of an n-type silicon carbide crystal doped with nitrogen as an n-type impurity was epitaxially grown to a thickness of 10 μm on surface 11a of substrate 11 by means of CVD (Chemical Vapor Deposition).

Next, as shown in FIG. 7, the direction orthogonal to the <−2110> direction in surface 12a of semiconductor layer 12 was inspected. Here, the direction orthogonal to the <−2110> direction in surface 12a of semiconductor layer 12 was identified based on the surface morphology of semiconductor layer 12.

Next, as shown in FIG. 18, second-conductive-type impurity diffusion layer 14 (p-type impurity concentration: 1×10$^{17}$ cm$^{-3}$) was formed in the whole of surface 12a of semiconductor layer 12.

Next, as shown in FIG. 19, in a part of the surface of second-conductive-type impurity diffusion layer 14 formed in the above-described manner, first-conductive-type impurity diffusion layer 15 (n-type impurity concentration: 5×10$^{19}$ cm$^{-3}$) and a p+-type region (not shown) (p-type impurity concentration: 3×10$^{19}$ cm$^{-3}$) were formed. Here, first-conductive-type impurity diffusion layer 15 was formed so that the surface of first-conductive-type impurity diffusion layer 15 had a stripe pattern, and the p+-type region was formed so that it had a stripe pattern and abutted on the side of first-conductive-type impurity diffusion layer 15 opposite to the side where a channel was formed. First-conductive-type impurity diffusion layer 15 was formed by using photolithography and etching to form a patterned oxide film in a region other than the region where first-conductive-type impurity diffusion layer 15 was to be formed in surface 12a of semiconductor layer 12, and implanting ions of phosphorous as an n-type impurity using the oxide film as an ion implantation block mask. The p+-type region was also formed by using photolithography and etching to form a patterned oxide film in a region other than the region where the p+-type region was to be formed in surface 12a of semiconductor layer 12, and implanting ions of boron as a p-type impurity using the oxide film as an ion implantation block mask.

Next, an activation annealing treatment was performed by heating semiconductor layer 12 in which second-conductive-type impurity diffusion layer 14, first-conductive-type impurity diffusion layer 15, and the p+-type region were formed in the above-described manner, in an argon gas atmosphere at 1700° C. for 30 minutes.

Next, as shown in FIG. 20, surface 12a of semiconductor layer 12 was heated in oxygen at 1200° C. for 30 minutes to be dry-oxidized (thermally oxidized) and thereby form insulating film 13 contacting the whole of surface 12a of semiconductor layer 12.

Next, a nitrogen annealing treatment was performed by heating semiconductor layer 12 on which insulating film 13 had been formed, in a nitrogen monoxide (NO) gas atmosphere at 1100° C. for 120 minutes.

Next, an inert gas annealing treatment was performed by heating semiconductor layer 12 having undergone the above-described nitrogen annealing treatment, in an argon gas atmosphere at 1100° C. for 60 minutes.

Next, insulating film 13 was patterned by removing a part of insulating film 13 formed in the above-described manner, so that the channel direction was the direction orthogonal to the <−2110> direction in surface 12a of semiconductor layer 12. Here, patterning of insulating film 13 was performed by forming, on the surface of insulating film 13, an etching mask patterned by photolithography and etching in order to expose a part-to-be-removed of insulating film 13, and thereafter etching and thereby removing the exposed part of insulating film 13.

Next, on the surface of first-conductive-type impurity diffusion layer 15 and the surface of the p+-type region (not shown) that had been exposed from the portion where insulating film 13 was removed, source electrode 16 and drain electrode 18 made of nickel and having a surface with a stripe pattern as shown in FIG. 17 and a thickness of 0.1 μm were formed.

Next, semiconductor layer 12 on which above-described source electrode 16 had been formed was heat-treated for alloying, by being heated in an argon gas atmosphere at 950° C. for two minutes.

Next, on the surface of insulating film 13, gate electrode 17 was formed that was made of aluminum and having a surface with a stripe pattern as shown in FIG. 17 and a thickness of 1 μm.

In this way, silicon carbide semiconductor device 100 was fabricated as a lateral MOSFET of the Example having the structure shown in FIG. 16.

Silicon carbide semiconductor device 100 to serve as a lateral MOSFET of the Example fabricated in the above-described manner had a channel length (the distance between source electrode 16 and drain electrode 18 adjacent to each other in surface 12a of semiconductor layer 12) of 2 μm.

Further, for comparison's sake, a silicon carbide semiconductor device to serve as a lateral MOSFET of a Comparative Example was fabricated in a manner similar to the above-described one, except that the channel direction was the <−2110> direction in surface 12a of semiconductor layer 12.

Evaluation of Lateral MOSFET

For the lateral MOSFETs of the Example and the Comparative Example fabricated in the above-described manner, the distribution, in the depth direction, of the nitrogen concentration in the vicinity of the interface between semiconductor layer 12 and insulating film 13 was measured by SIMS (secondary ion mass spectrometry).

As a result, it was found that the maximum value of the nitrogen concentration in the vicinity of the interface between semiconductor layer 12 and insulating film 13 was $1\times10^{21}$ $cm^{-3}$ or more in both respective lateral MOSFETs of the Example and the Comparative Example. It was thus confirmed that the maximum value of the nitrogen concentration in a region within 10 nm from the interface between semiconductor layer 12 and insulating film 13 was not less than $1\times10^{21}$ $cm^{-3}$ in each of respective lateral MOSFETs of the Example and the Comparative Example.

Further, for the lateral MOSFETs of the Example and the Comparative Example, the channel mobility was evaluated. For evaluating the channel mobility, the following method was used. First, under the condition that the source-drain voltage was VDS=0.1 V, a gate voltage VG was applied to measure a source-drain current IDS (to measure the gate voltage dependency). Then, Expression (1) below where gm= (δIDS)/(δVG) was used to determine the maximum value of the channel mobility for the gate voltage, and the maximum value was calculated as the channel mobility.

$$\text{Channel mobility } \mu = gm \times (L \times d)/(W \times \in \times VDS) \quad (1)$$

In Expression (1) above, L represents the channel length, d represents the thickness of insulating film 13, W represents the channel width, and ∈ represents the dielectric constant of insulating film 13.

Consequently, it was found that the channel mobility of the lateral MOSFET of the Example was 80 $cm^2$/Vs and the channel mobility of the lateral MOSFET of the Comparative Example was 70 $cm^2$/Vs.

As seen from the above, the channel mobility of the lateral MOSFET of the Example was about 1.14 times as high as the channel mobility of the lateral MOSFET of the Comparative Example, and accordingly the source-drain current value was 1.14 times. Thus, a significant reduction in ON resistance was confirmed.

It is therefore considered that in the structure of the lateral MOSFET of the Example, the channel mobility is unlikely to considerably decrease even when the channel mobility varies to a certain extent depending on problems in manufacture, and thus a high channel mobility can be achieved with high reproducibility.

It should be construed that embodiments and examples disclosed herein are by way of illustration in all respects, not by way of limitation. It is intended that the scope of the present invention is defined by claims, not by the description above, and encompasses all modifications and variations equivalent in meaning and scope to the claims.

INDUSTRIAL APPLICABILITY

Since the present invention can provide a silicon carbide semiconductor device that can achieve a high channel mobility with high reproducibility as well as a method of manufacturing the same, the present invention is suitably applicable for example to a vertical DiMOSFET, a lateral MOSFET and the like in which SiC is used.

REFERENCE SIGNS LIST 1, 100 silicon carbide semiconductor device; 10 silicon carbide crystal ingot; 11 substrate; 11a surface; 12 semiconductor layer; 12a surface; 13 insulating film; 14 second-conductive-type impurity diffusion layer; 15 first-conductive-type impurity diffusion layer; 16 source electrode; 17 gate electrode; 18 drain electrode.

The invention claimed is:

1. A silicon carbide semiconductor device comprising:
a hexagonal crystal semiconductor layer made of silicon carbide and having a surface tilted at an angle in a range of not less than 50° and not more than 65° relative to a {0001} plane; and
an insulating film formed to contact said surface of said semiconductor layer,
a maximum value of a nitrogen concentration in a region within 10 nm from an interface between said semiconductor layer and said insulating film being not less than $1\times10^{21}$ $cm^{-3}$, and
said silicon carbide semiconductor device having a channel direction in a range of ±10° relative to a direction orthogonal to a <−2110> direction in said surface of said semiconductor layer.

2. A silicon carbide semiconductor device comprising:
a substrate made of silicon carbide of a first conductive type;
a hexagonal crystal semiconductor layer made of silicon carbide of the first conductive type, formed on said substrate, containing a first-conductive-type impurity of a lower concentration than said substrate, and having a surface tilted at an angle in a range of not less than 50° and not more than 65° relative to a {0001} plane;
a second-conductive-type impurity diffusion layer formed in said surface of said semiconductor layer;
a first-conductive-type impurity diffusion layer formed in a surface of said second-conductive-type impurity diffusion layer;
an insulating film formed to contact said surface of said semiconductor layer;
a source electrode formed to contact at least a part of a region, except for a portion where said insulating film is formed, of said surface of said semiconductor layer;
a gate electrode formed on said insulating film; and
a drain electrode formed on a surface of said substrate opposite to a surface of said substrate on which said semiconductor layer is formed,
a maximum value of a nitrogen concentration in a region within 10 nm from an interface between said semiconductor layer and said insulating film being not less than $1\times10^{21}$ $cm^{-3}$, and
said silicon carbide semiconductor device having a channel direction in a range of ±10° relative to a direction orthogonal to a <−2110> direction in said surface of said semiconductor layer.

3. The silicon carbide semiconductor device according to claim 2, wherein said source electrode has a surface in a stripe pattern.

4. The silicon carbide semiconductor device according to claim 2, wherein said source electrode has a surface in a honeycomb pattern.

5. A silicon carbide semiconductor device comprising:
a substrate made of silicon carbide of a first conductive type;
a hexagonal crystal semiconductor layer made of silicon carbide of the first conductive type, formed on said substrate, containing a first-conductive-type impurity of a lower concentration than said substrate, and having a surface tilted at an angle in a range of not less than 50° and not more than 65° relative to a {0001} plane;

a second-conductive-type impurity diffusion layer formed in said surface of said semiconductor layer;

a first-conductive-type impurity diffusion layer formed in a surface of said second-conductive-type impurity diffusion layer;

an insulating film formed to contact said surface of said semiconductor layer;

a source electrode formed to contact a part of a region, except for a portion where said insulating film is formed, of said surface of said semiconductor layer;

a drain electrode formed to contact another part of the region, except for the portion where said insulating film is formed, of said surface of said semiconductor layer; and a gate electrode formed on said insulating film, a maximum value of a nitrogen concentration in a region within 10 nm from an interface between said semiconductor layer and said insulating film being not less than $1\times10^{21}$ cm$^{-3}$, and said silicon carbide semiconductor device having a channel direction in a range of ±10° relative to a direction orthogonal to a <-2110> direction in said surface of said semiconductor layer.

6. The silicon carbide semiconductor device according to claim 5, wherein said source electrode has a surface in a stripe pattern.

7. The silicon carbide semiconductor device according to claim 1, wherein said surface of said semiconductor layer is a crystal plane tilted at an angle in a range of ±5° relative to a {03-38} plane.

8. A method of manufacturing a silicon carbide semiconductor device, comprising the steps of:

forming a hexagonal crystal semiconductor layer having a surface tilted at an angle in a range of not less than 50° and not more than 65° relative to a {0001} plane;

inspecting a direction orthogonal to a <-2110> direction in said surface of said semiconductor layer;

forming an insulating film contacting a part of said surface of said semiconductor layer so that a channel direction is set in a range of ±10° relative to the direction orthogonal to the <-2110> direction in said surface of said semiconductor layer; and adjusting a nitrogen concentration so that a maximum value of the nitrogen concentration in a region within 10 nm from an interface between said semiconductor layer and said insulating film is not less than $1\times10^{21}$ cm$^{-3}$.

9. The method of manufacturing a silicon carbide semiconductor device according to claim 8, wherein the direction orthogonal to the <-2110> direction in said surface of said semiconductor layer is inspected based on an orientation of a defect included in said semiconductor layer.

10. The method of manufacturing a silicon carbide semiconductor device according to claim 8, wherein said step of adjusting the nitrogen concentration includes the step of performing a heat treatment in an atmosphere of a gas containing nitrogen, on said semiconductor layer where said insulating film is formed.

11. The method of manufacturing a silicon carbide semiconductor device according to claim 10, wherein said step of adjusting the nitrogen concentration includes the step of performing, on said semiconductor layer having undergone said heat treatment, a heat treatment in an atmosphere of an inert gas.

* * * * *